United States Patent [19]

Harwood

[11] 4,032,967
[45] June 28, 1977

[54] COMPLEMENTARY FIELD EFFECT TRANSISTOR SIGNAL MULTIPLIER

[75] Inventor: Leopold Albert Harwood, Somerville, N.J.

[73] Assignee: RCA Corporation, New York, N.Y.

[22] Filed: May 28, 1976

[21] Appl. No.: 691,205

[52] U.S. Cl. .................................. 358/23; 307/251; 329/50
[51] Int. Cl.² .................. H04N 9/50; H03K 17/56; H03D 3/18
[58] Field of Search ........................ 358/23; 329/50; 307/251; 330/35, 38 M

[56] References Cited

UNITED STATES PATENTS

| | | | |
|---|---|---|---|
| 3,466,386 | 9/1969 | Dias et al. | 329/50 X |
| 3,558,810 | 1/1971 | Cecchin et al. | 358/23 |
| 3,740,461 | 6/1973 | Harwood | 329/50 X |
| 3,987,481 | 10/1976 | Renaud | 358/23 |

*Primary Examiner*—John C. Martin
*Assistant Examiner*—Aristotelis M. Psitos
*Attorney, Agent, or Firm*—Eugene M. Whitacre; Ronald H. Kurdyla

[57] ABSTRACT

An electrical signal multiplier comprises a pair of signal transmission gates each including a pair of parallel coupled, opposite conductivity field effect transistors. An input signal which, for example, is to be demodulated, is applied in balanced, push-pull relation to each of the transmission gates, respectively. Balanced push-pull reference switching signals render the transmission gates conductive and non-conductive, in complementary fashion, during alternate switching intervals. Output (demodulated) signals are provided alternately at signal outputs of the transmission gates.

10 Claims, 1 Drawing Figure

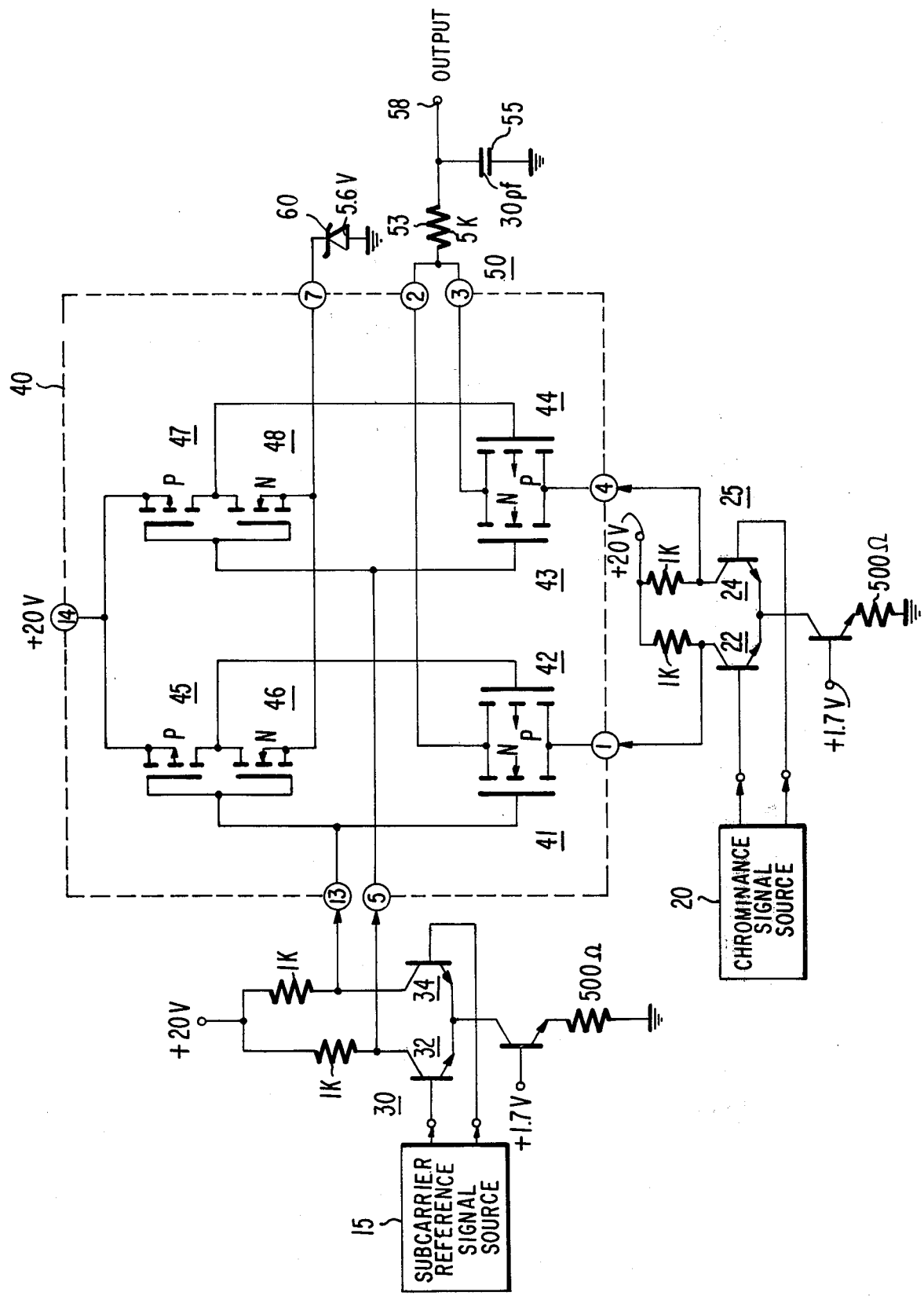

COMPLEMENTARY FIELD EFFECT TRANSISTOR SIGNAL MULTIPLIER

This invention relates to electrical signal multiplier circuits and, more particularly, to such circuits which employ field effect transistors and which are adapted to integrated circuit techniques.

Various types of multiplier circuits employing bipolar transistors are known. The output from such bipolar transistor multipliers typically includes a direct current offset voltage component resulting from the base-emitter junction voltage of the bipolar transistor. If such circuits are not "doubly balanced", the output will also include an alternating current component caused by the switching signal. Furthermore, the range of signal amplitudes for which the bipolar device exhibits linear characteristics is limited to an amplitude significantly less than the total applied direct operating voltage (B+).

One type of a signal multiplier of the form of a balanced synchronous demodulator employing field effect transistors is described in U.S. Pat. No 3,246,177, granted Apr. 12, 1966, to J. O. Schroeder and assigned to the assignee of the present invention. In the Schroeder patent, a pair of parallel coupled, similar conductivity insulated gate field effect transistors serve to demodulate an amplitude modulated signal in response to a reference demodulating or switching signal. Each of the field effect transistors of the illustrated Schroeder circuit essentially operates as a signal transmission gate. The switching signal is clamped to a fixed, relatively low level prior to application to the gating transistors. This is done to obtain symmetrical, linear circuit operation by avoiding distortion due to unsymmetrical, non-linear conduction characteristics of the field effect transistors in the presence of a gate switching signal of relatively large amplitude. It is desirable to eliminate such clamping action and thereby reduce circuit complexity and cost. It is further desirable to increase the flexibility of the circuit to accept a wide range of input signal amplitudes such as may be encountered in actual use, while maintaining linear and symmetrical circuit operation.

A modified form of signal transmission gate comprising a pair of parallel coupled, complementary conductivity insulated gate field effect transistors is described in U.S. Pat. No. 3,457,435, granted July 22, 1969, to J. R. Burns and J. J. Gibson and assigned to the present assignee.

In many instances, as for example in the case of the chrominance processing portion of a color television receiver, modulators or demodulators are required having a linear and symmetrical response, low power consumption, an ability to accept and process signals over a wide range of signal amplitudes, and substantially no voltage offset to facilitate direct current coupling. In such a system, direct coupled amplitude and phase demodulators are often employed for color difference signal demodulation, automatic color control (ACC) and automatic frequency and phase control (AFPC) functions, and direct coupled phase modulators are often used for generating a phase modulated subcarrier color reference signal.

Electrical signal multiplier apparatus according to the present invention comprises first and second pairs of parallel coupled, complementary conductivity field effect transistors. Each transistor has input and output electrodes defining a conduction path, and a control electrode for controlling the conductivity of the conduction path. First and second mutually antiphase input signals are applied to one of the input or control electrodes of the first transistor pair, and to one of the input or control electrodes of the second transistor pair, respectively. Complementary polarity alternating reference switching signals are applied to the other of the input or control electrodes of the first and second transistor pairs to render the transistor pairs respectively conductive and non-conductive in a complementary manner during alternate switching intervals. Output signals which are the product of the applied input and switching signals are provided alternately at the output electrodes of the first transistor pair and at the output electrodes of the second transistor pair substantially free of switching signals and junction offset voltage components.

The drawing is a schematic circuit diagram, partially in block form, of a chrominance signal demodulator embodying the invention which may be employed in a color television receiver and is suitable for construction in integrated circuit form.

Referring to the drawing, push-pull (relatively antiphase) composite chrominance signals to be demodulated are coupled from a source of chrominance signals 20 to a differential amplifier 25 including, for example, emitter coupled transistors 22 and 24. The chrominance signal contains R-Y, B-Y and G-Y color difference signal components each having a phase representative of hue and being amplitude modulated with information representative of color saturation. Differential amplifier 25 provides an amplified chrominance signal of, for example, one volt peak-to-peak amplitude which appears in push-pull relation at collector electrodes of transistors 22 and 24.

Push-pull color subcarrier reference signals are coupled from a source of such signals 15 to a differential amplifier 30 including emitter coupled transistors 32 and 34. The reference signals are of the same frequency (3.58 MHz) as the chrominance signal subcarrier and are in phase synchronism with one of the color difference signal components which is to be amplitude demodulated (e.g., the R-Y component). Differential amplifier 30 limits the amplitude of the reference signal to provide an output switching signal of, for example, four volts peak-to-peak amplitude. In the case of an amplitude demodulator, the reference or switching signal is amplitude limited so that a demodulated output signal represents substantially only the amplitude modulation information of the signal to be demodulated. The switching signal appears in push-pull relation at collector electrodes of transistors 32 and 34.

The push-pull chrominance signals from amplifier 25 and the push-pull switching signals from limiter amplifier 30 are coupled to a balanced synchronous demodulator 40 via input terminals 1, 4 and 5, 13, respectively. The circuit elements included in demodulator 40 may be provided, for example, by a portion of an integrated circuit type CD4016A marketed by RCA Solid State Division, Somerville, N.J. The CD4016A integrated circuit includes an array of complementary conductivity, insulated gate metal oxide semiconductor field effect transistors (MOSFETs). Terminals 1–5 and 7, 13, 15 of demodulator 40 correspond numerically to the same terminals of the CD4016A integrated circuit.

In the demodulator 40, an N-channel MOSFET device 41 and an opposite (complementary) conductivity P-channel MOSFET device 42 form a first signal transmission gate. Devices 41 and 42 have input source electrodes connected together and to input terminal 1, and have output drain electrodes connected together and to an output terminal 2. Similarly, an N-channel MOSFET device 43 and a P-channel MOSFET device 44 form a second signal transmission gate. Devices 43 and 44 have input source electrodes connected together and to input terminal 4, and have output drain electrodes connected together and to an output terminal 3. It is noted that for a typical MOSFET device the function of the drain and source electrodes can be interchanged because of symmetrical device geometry. That is, in the conductive state, current flows equally well from the drain to the source electrode or from the source to the drain electrode.

Push-pull switching signals are respectively coupled to a gate electrode of device 41 via terminal 13, and to a gate electrode of device 42 via terminal 13 and a complementary conduction signal inverter stage including opposite conductivity P and N-channel MOSFET devices 45 and 46. Gate electrodes of devices 45 and 46 are connected in common to input terminal 13. A source electrode of device 45 is connected to an operating supply voltage of, for example, +20 volts. Drain electrodes of devices 45, 46 are interconnected and coupled to the gate electrode of device 42 for providing a switching signal for device 42 of opposite polarity to that of the switching signal which is applied directly to the gate of device 41 from terminal 13.

Push-pull switching signals are respectively coupled to a gate electrode of device 43 via terminal 5, and to a gate electrode of device 44 via terminal 5 and a complementary conduction signal inverter stage including MOSFET devices 47 and 48. Devices 47 and 48 are arranged in the same manner as devices 45 and 46 and serve a similar purpose.

Source electrodes of devices 46 and 48 are coupled in common to a terminal 7. A zener diode 60 assists symmetrical operation of demodulator 40 by providing a reference offset voltage to compensate for a direct voltage component of the switching signal supplied by limiter amplifier 30. Output terminals 2 and 3 are coupled to a load resistor 53 to form an output signal combining network 50 for summing demodulated signals appearing at the output drain electrodes of devices 41, 42 and 43, 44. A filter capacitor 55 removes residual higher order harmonics of the switching signal from the demodulated output signal.

It is noted that signal transmission devices 41, 42 and 43, 44 essentially serve as voltage switching devices and do not require independent operating current supplies as bipolar transistor arrangements commonly do. Biasing requirements and circuit complexity are therefore substantially reduced.

The operation of demodulator 40 will be described in the context of demodulating the chrominance signal to obtain the R-Y color difference signal component. Accordingly, the phase of the subcarrier reference signal and hence the phase of the switching signal is in synchronism with the phase of the R-Y signal component.

A first operating interval of demodulator 40 corresponds to a first half cycle of the chrominance signal. For this interval it will be assumed for purposes of explanation that the push-pull switching signals coupled to input terminals 13 and 5 are of relatively positive and negative polarity, respectively.

Signals representing the first half cycle of the chrominance signal, of R-Y signal phase, appear in push-pull relation at the collectors of transistors 22 and 24 of amplifier 25. A positive polarity switching signal is applied to the gate of device 41 via terminal 13 and a relatively negative polarity switching signal is applied to the gate of device 42. The latter switching signal is produced by the signal inverting action of inverter 45, 56. That is, the positive switching signal from terminal 13 renders device 46 conductive to produce an inverted, negative polarity switching signal at its drain electrode. Device 45 is not conductive at this time. The switching signals applied to the gate electrodes of devices 41, 42 are of a polarity to cause both of these devices to conduct. The signal appearing at the collector of transistor 22, representing the amplitude of the first half cycle of the R-Y signal component, is therefore transmitted via conductive devices 41, 42 to output terminal 2.

Also during this time, a relatively negative polarity switching signal is applied to the gate of device 43 via terminal 5, and a relatively positive polarity switching signal is applied to the gate of device 44 via inverter 47, 48. In this case, the negative switching signal from terminal 5 renders device 47 conductive to produce an inverted, positive polarity switching signal at its drain electrode. Device 48 does not conduct at this time. The negative and positive polarity switching signals coupled to the gate electrodes of devices 43 and 44 at this time are such that devices 43 and 44 do not conduct. Devices 43 and 44 therefore do not transmit signal to output terminal 3.

During a second operating interval of demodulator 40, corresponding to the remaining half cycle of the chrominance signal, the push-pull switching signals coupled to input terminals 13 and 5 reverse polarity. The chrominance signal likewise reverses polarity. During this interval, the polarity of the switching signals coupled to the gate electrodes of devices 41, 42 and 43, 44 is such that devices 41, 42 are non-conductive and devices 43, 44 are conductive. In this case it is noted that inverter devices 46 and 47 are non-conductive while inverter devices 45 and 48 conduct to provide an inverted switching signal for application to the gate electrodes of devices 42 and 44. The signal appearing at the collector of transistor 24, representing the amplitude of the remaining half cycle of the R-Y signal component, is therefore transmitted via conductive devices 43, 44 to output terminal 3.

By the described manner of operation, demodulator 40 synchronously demodulates the chrominance signal to provide full wave amplitude demodulation of the R-Y color difference signal component. It is noted that each of the transmission gates 41, 42 and 43, 44 of demodulator 40 exhibits a substantially linear, symmetrical conduction characteristic. This feature is attributable to the fact that each transmission gate is formed by a pair of parallel coupled, mutually opposite conductivity N and P-channel devices. It is furthermore noted that devices 41, 42 and 43, 44 desirably transmit the difference signal component from input to output without producing a direct voltage offset. Direct current coupling is therefore simplified, making the circuit particularly attractive for integrated circuit implementation.

Demodulated signals provided by devices 41, 42 and 43, 44 are combined via interconnected output terminals 2 and 3 and resistor 53 of network 50 to produce a full wave demodulated signal of about 8 volts peak-to-peak amplitude representing a full cycle of the R-Y component. The demodulated R-Y component can then be coupled from an output terminal 58 to be subsequently summed with a luminance (Y) component of a video signal for deriving a red (R) color-representative signal.

In sum, a wide bandwidth demodulator of the multiplier type has been described which is simple, reliable and economical. The multiplier does not require reactive circuit components and is compatible with integrated circuit techniques. It is noted that diode 60 is not required in the absence of a direct voltage component of the switching signal. Moreover, filter capacitor 55 is not essential to suppress the switching signal in the output, since the switching signal is substantially cancelled in the output of each transmission gate when balanced, push-pull input switching signals are used. Still further, switching signal inverter stages corresponding to stages 45, 46 and 47, 48 are not required when there is such access to the gate electrodes of the transmission gate devices as would permit coupling push-pull switching signals to the individual devices directly.

A further feature of a circuit according to the invention is that transmission gate MOSFET devices 41, 42 and 43, 44 exhibit a very high input impedance, thereby permitting direct coupling to high impedance signal sources. Practically no input switching power is required, so that several devices can be driven from the same signal source, if necessary, with negligible additional power consumption. Such devices also desirably exhibit very high and very low conduction resistance when in the non-conductive and conductive stages, respectively, as well as negligible leakage currents.

Although the invention has been described in terms of a specific circuit embodiment, it should be appreciated that other signal multiplier arrangements may be devised by those skilled in the art without departing from the scope of the invention. Either junction type or insulated gate (MOS) type field effect transistors may be used in a circuit according to the invention. The described demodulator can be employed in a frequency modulation (FM) receiver to amplitude demodulate a subcarrier signal component of a composite FM signal. In this case, a separated or locally generated pilot signal (e.g., 19 or 38 KHz) would be coupled to reference switching signal input terminals 5 and 13 of demodulator 40, and the subcarrier component would be coupled to input terminals 1 and 4. Demodulator 40 can also serve as a phase demodulator. Here, both an input reference switching signal and an input signal to be phase demodulated would be coupled to demodulator 40 in amplitude limited form. Demodulator 40 would then provide an output signal representing the phase difference between the input signals.

Apparatus according to the invention may also be empolyed as a signal modulator of the multiplier type to generate a modulated subcarrier color reference signal for use in a color television receiver, for example. Here, a subcarrier color reference signal of a frequency of 3.58 MHz would be coupled to input terminals 5 and 13 of circuit 40, and a modulating signal would be coupled to terminals 1 and 4, whereby the modulated subcarrier signal would appear at output terminals 2 and 3.

What is claimed is:
1. Electrical signal multiplier apparatus comprising:

a first pair of parallel coupled, complementary conductivity field effect transistors each having an input electrode and an output electrode defining a conduction path therebetween, and a control electrode for controlling the conductivity of said path;
a second pair of parallel coupled, complementary conductivity field effect transistors each having an input electrode and an output electrode defining a conduction path therebetween, and a control electrode for controlling the conductivity of said last-named path;
means for applying first and second mutually antiphase alternating input signals to one of said input or control electrodes of said first transistor pair and to one of said input or control electrodes of said second transistor pair, respectively; and
means for applying complementary polarity alternating reference switching signals to the other of said input or control electrodes of said first and second transistor pairs to render said transistor pairs respectively conductive and non-conductive in a complementary manner during alternate switching intervals, whereby output signals are provided alternately at said output electrodes of said first transistor pair and at said output electrodes of said second transistor pair representative of the product of said input and switching signals, said product being substantially free of said switching signals and free of junction offset voltage components.

2. Apparatus according to claim 1 and further comprising:
means coupled to said output electrodes of said first and second transistor pairs for providing a combined output signal.

3. Apparatus according to claim 1, wherein:
said first and second transistor pairs comprise insulated gate field effect transistors; and
said input, output and control electrodes respectively correspond to source, drain and gate electrodes.

4. Apparatus according to claim 1, wherein:
said input signal contains amplitude modulation information to be demodulated; and
said reference signal exhibits a substantially constant amplitude and is in phase synchronism with said input signal, whereby said apparatus provides an output signal representative of said amplitude modulation information.

5. Apparatus according to claim 1, wherein:
said input signal and said reference switching signal each exhibit a substantially constant amplitude, whereby said apparatus provides an output signal representative of a phase difference between said input signal and said reference signal.

6. Apparatus according to claim 1, wherein:
said signal applied to said control electrodes corresponds to a signal to be modulated; and
said signal applied to said input electrodes contains modulation information, whereby said apparatus provides an output signal modulated by said information.

7. In a system for processing color television signals including a chrominance signal having a phase representative of hue and an amplitude representative of saturation of colors present in a scene, apparatus for demodulating said chrominance signals comprising:
a first pair of parallel coupled, complementary conductivity insulated gate field effect transistors each having gate, source and drain electrodes;

a second pair of parallel coupled, complementary conductivity insulated gate field effect transistors each having gate, source and drain electrodes;

means for coupling first and second mutually antiphase chrominance signals to one of said source or gate electrodes of said first transistor pair and to one of said source or gate electrodes of said second transistor pair, respectively;

means for coupling complementary polarity reference switching signals to the other of said source or gate electrodes of said first and second transistor pairs to render said transistor pairs respectively conductive and non-conductive in a complementary manner during alternate switching intervals, whereby demodulated chrominance signal is provided alternately at said drain electrodes of said first transistor pair and at said drain electrodes of said second transistor pair; and impedance means coupled to said drain electrodes for providing a combined demodulated chrominance signal substantially free of said switching signals and substantially free of junction offset voltage components.

8. Apparatus according to claim 7, wherein:

said chrominance signal includes a color difference signal component containing amplitude modulation color saturation information;

said reference signal exhibits a substantially constant amplitude; and said difference signal component and said reference signal are in phase and frequency synchronism, whereby said apparatus provides an output signal representative of said amplitude modulation information.

9. Apparatus according to claim 8, wherein:

said antiphase chrominance signals are coupled to source electrodes of said first and second transistor pairs, respectively; and said reference switching signals are coupled to gate electrodes of said first and second transistor pairs, respectively.

10. Apparatus according to claim 7, wherein:

said chrominance signal and said reference signal each exhibit a substantially constant amplitude, whereby said apparatus provides an output signal representative of a phase difference between said chrominance signal and said reference signal.

* * * * *